(12) United States Patent
Lai et al.

(10) Patent No.: US 11,341,895 B2
(45) Date of Patent: May 24, 2022

(54) METHOD FOR CANCELING CROSSTALK OF QLED DISPLAY PANEL AND QLED DISPLAY PANEL

(71) Applicant: NATIONAL TSING HUA UNIVERSITY, Hsinchu (TW)

(72) Inventors: Kuo-Yang Lai, Hsinchu (TW); Hsueh-Shih Chen, Hsinchu (TW)

(73) Assignee: NATIONAL TSING HUA UNIVERSITY, Hsinchu (TW)

(*) Notice: Subject to any disclaimer, the term of this patent is extended or adjusted under 35 U.S.C. 154(b) by 22 days.

(21) Appl. No.: 16/920,147

(22) Filed: Jul. 2, 2020

(65) Prior Publication Data
US 2021/0319741 A1    Oct. 14, 2021

(30) Foreign Application Priority Data
Apr. 8, 2020    (TW) .................................. 109111811

(51) Int. Cl.
*G09G 3/20*   (2006.01)
*H01L 51/50*  (2006.01)

(52) U.S. Cl.
CPC .......... *G09G 3/2092* (2013.01); *H01L 51/502* (2013.01); *H01L 51/5056* (2013.01); *H01L 51/5072* (2013.01); *G09G 2320/0214* (2013.01); *H01L 2251/306* (2013.01); *H01L 2251/308* (2013.01)

(58) Field of Classification Search
CPC .......... G09G 2320/0214; G09G 3/2092; H01L 2251/306; H01L 2251/308; H01L 51/502; H01L 51/5056; H01L 51/5072
See application file for complete search history.

(56) References Cited

U.S. PATENT DOCUMENTS

| | | | |
|---|---|---|---|
| 2020/0028090 A1* | 1/2020 | Zhang | C09K 11/06 |
| 2020/0035941 A1* | 1/2020 | Yoo | H01L 51/5209 |
| 2020/0058889 A1* | 2/2020 | Liang | H01L 33/26 |

\* cited by examiner

*Primary Examiner* — Afroza Chowdhury

(57) ABSTRACT

A method for application in a QLED display device is provided for cancelling optical crosstalk occurring in a QLED display panel consisting of M number of anode wires, N number of cathode wires, and M×N number of QLED elements. In case of the method being implemented in the QLED display device, a control unit is configured for controlling a column driver unit to supply a positive bias voltage to at least one QLED element that is addressingly selected. In the meantime, the control unit also controls a low driver unit to supply a reverse bias voltage to each of the QLED elements that are not selected. In such case, when the addressingly-selected QLED element achieves a light emission normally, each of the QLED elements that are not selected is reversely biased for failing to produce optical crosstalk.

9 Claims, 13 Drawing Sheets

METHOD FOR CANCELING CROSSTALK OF QLED DISPLAY PANEL AND QLED DISPLAY PANEL

BACKGROUND OF THE INVENTION

1. Field of the Invention

The present invention relates to the technology field of QLED display device, and more particularly to a QLED display panel and a method for canceling optical crosstalk of the QLED display panel.

2. Description of the Prior Art

Liquid crystal display (LCD) device and plasma display device are two well-known flat-panel display devices. LCD device is classified as a non-self-emissive flat-panel display device, and commonly consists of a LED backlight module, an LCD panel, at least one color filter, and a display controlling circuit. By using the display controlling circuit, the backlight module is driven to provide a white backlight to pass through the LCD panel. Subsequently, the white backlight continuously passes through the color filter, so as to be converted to a red light, a green light and a blue light for being used as a red sub-pixel, a green sub-pixel and a blue sub-pixel. According to statistical data, the LCD device having the white-light LED backlight module can merely exhibit a best color gamut of 72% NTSC.

Flat-panel displays have come a long way from where they were even 10 years ago. As display device makers seek out the next technology to provide a clearer, more responsive picture, self-emissive flat-panel display devices are therefore developed and proposed. Along with the self-emissive flat-panel display devices using OLED panel or MicroLED panel are on the way, display device makers is simultaneously working to create a self-emissive flat-panel display device using QLED display panel.

FIG. 1 shows a schematic stereo diagram of a conventional QLED display panel, and FIG. 2 illustrates a first block diagram of a conventional QLED display device using the forgoing QLED display panel. Moreover, FIG. 3 depicts a second block diagram of the conventional QLED display device. As FIG. 2 and FIG. 3 show, the conventional QLED display device 1' mainly comprises a QLED display panel 11', a row driver unit 12', a column driver unit 13', and a control unit 14'. From FIG. 1, FIG. 2 and FIG. 3, it is known that the QLED display panel 11' comprises a substrate 110', M number of anode wires 11A', N number of cathode wires 11C', and M×N number of QLED elements 111'. In which, the QLED element 111' comprises a hole transport layer 11HI' connected to the anode wire 11A', an electron transport layer 11EI' connected to the cathode wire 11C', and an emission layer 1EM' that is formed between the electron transport layer 11EI' and the hole transport layer 11HI'.

After an external graphics processing unit (GPU) or a host processor transmits a display data to the control unit 14', the control unit 14' correspondingly generates and transmits a first control signal and a second control signal to the row driver unit 12' and the column driver unit 13', respectively, thereby controlling the row driver unit 12' and the column driver unit 13' transmit a row drive signal and a column drive signal to the QLED display panel 11'. As described in more detail below, the column driver unit 13' is controlled to transmit the column drive signal like a 5-V voltage signal to an N-th column of anode wire 11A', and the row driver unit 12' is controlled to transmit the row drive signal such as a ground signal to an M-th row of cathode wire 11C', so as to addressingly select at least one QLED element 111' to achieve a light emission.

However, experience of practically applying the QLED display panel 11' has revealed that, a voltage coupling effect is found to easily occur between the N-th column of anode wire 11A' that transmits the 5-V voltage signal and at least one anode wire 11A' that is adjacent to the N-th column of anode wire 11A'. In a similar way, the voltage coupling effect is also found to easily occur between the M-th row of cathode wire 11C' that transmits the ground signal and at least one cathode wire 11C' that is adjacent to the M-th row of cathode wire 11C'. In such case, as FIG. 3 shows, several QLED elements 111' adjacent to the addressingly-selected QLED element 111' would also be driven to emit light with slight intensity, thereby producing optical crosstalk in the QLED display panel 11'.

From above descriptions, it is understood that there is still room for improvement in the conventional QLED display panel. In view of that, inventors of the present application have made great efforts to make inventive research and eventually provided a QLED display panel and a method for canceling optical crosstalk of the QLED display panel.

SUMMARY OF THE INVENTION

A first objective of the present invention is to disclose a method for application in a QLED display device so as to cancel optical crosstalk occurring in a QLED display panel of the QLED display device. The QLED display device comprises the QLED display panel, a low driver unit, a column driver unit, and a control unit, wherein the QLED display panel comprises M number of anode wires, N number of cathode wires, and M×N number of QLED elements. In case of the method being implemented in the QLED display device, the control unit controls the column driver unit to supply a positive bias voltage to at least one QLED element that is addressingly selected. In the meantime, the control unit also controls the low driver unit to supply a reverse bias voltage to each of the QLED elements that are not selected. In such case, when the addressingly-selected QLED element achieves a light emission normally, each of the QLED elements that are not selected is reversely biased for failing to produce an optical crosstalk.

A second objective of the present invention is to disclose a QLED display panel, which is designed to have a particular electrode structure, and the particular electrode structure is helpful in reducing and/or canceling optical crosstalk during a normal operation of the QLED display panel.

A third objective of the present invention is to disclose a QLED display panel, wherein a particularly-designed quantum dot (QD) is applied in the QLED display panel, thereby reducing and/or canceling optical crosstalk during a normal operation of the QLED display panel.

For achieving the forgoing first objective of the present invention, an embodiment of the method for canceling optical crosstalk of the QLED display panel is provided, and is applied in a QLED display device that comprises a QLED display panel, a low driver unit, a column driver unit, and a control unit; wherein the QLED display panel comprises M number of anode wires, N number of cathode wires, and M×N number of QLED elements, and the method comprising following steps:

letting the control unit control the column driver unit to transmit a column drive signal to at least one of the M number of anode wires, so as to let the at least one anode wire be addressingly selected;

in case of the column drive signal is transmitted in the at least one addressingly-selected anode wire, letting the control unit control the row driver unit to transmit a first row drive signal to at least one of the N number of cathode wires that has an space overlap or a space intersection with the addressingly-selected anode wire, and letting the control unit control the row driver unit to simultaneously transmit a second row drive signal to the other of the N number of cathode wires that not overlap or intersect with the addressingly-selected anode wire in space;

wherein the second row drive signal and the column drive signal has an identical timing waveform.

In one embodiment of the forgoing method, the row driver unit is provided with a signal switch therein, and the signal switch comprises:

a first signal switching unit, being used for coupling the first row drive signal to the at least one cathode wire that has the space overlap or the space intersection with the at least one addressingly-selected anode wire; and a second signal switching unit, being used for coupling the second row drive signal to the cathode wires that not overlap or intersect with the addressingly-selected anode wire in space.

In one embodiment of the forgoing method, both the column drive signal and the second drive signal are selected from the group consisting of bias voltage signal and bias current signal.

For achieving the forgoing second objective of the present invention, a first embodiment of the QLED display panel is provided, comprising:

a substrate;

a plurality of anode layers, being formed on the substrate, and being arranged to M rows and N columns;

M×N number of QLED elements, being formed on the plurality of anode layers, respectively;

M number of cathode wires, being formed on the M×N number of QLED elements, so as to make each of the M number of cathode wires be connected with N of the M×N number of QLED elements;

N number of column wires, being formed on the substrate; wherein each of the N number of column wires has M number of extension portions, and each of the M number of extension portions covering a part of one of the plurality of anode layers, such that each of the N number of column wires is electrically connected to M of the plurality of anode layers;

wherein both M and N are a positive integer, and each of the N number of column wires being further covered by an insulation layer.

For achieving the forgoing third objective of the present invention, a second embodiment of the QLED display panel is provided, comprising:

a substrate;

N number of anode wires, being formed on the substrate;

M×N number of QLED elements, being formed on the N number of anode wires, so as to make each of the N number of anode wires be connected with M of the M×N number of QLED elements; and M number of cathode wires, being formed on the M×N number of QLED elements, so as to make each of the M number of cathode wires be connected with N of the M×N number of QLED elements;

wherein both M and N are a positive integer, and the QLED element comprising: a hole transport layer, being formed on the anode wire;

an emission layer, being formed on the hole transport layer; and an electron transport layer, being formed on the emission layer, and being connected with the cathode wire;

wherein the emission layer comprises a conducting polymer film and a plurality of quantum dots (QDs) that are incorporated in the conducting polymer film;

wherein the QD comprises a core and at least one shell layer, and a diameter of the QD and a thickness of the at least one shell layer having a specific ratio that is in a range between 1.3 and 2.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a QLED display panel and a method for canceling optical crosstalk of the QLED display panel, embodiments of the present invention will be described in detail with reference to the attached drawings hereinafter.

Method for Canceling Optical Crosstalk of Qled Display Panel

Figure 4:
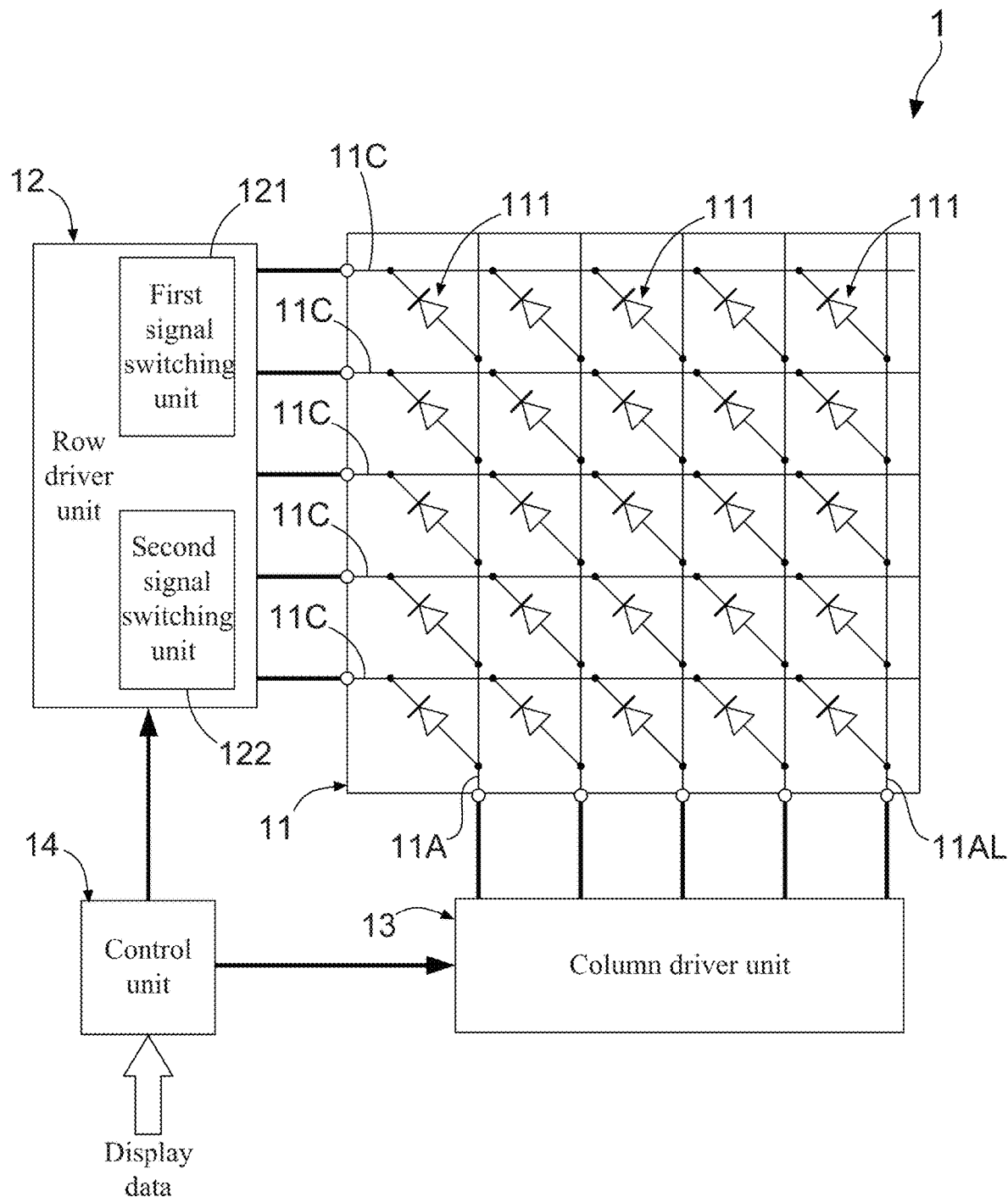
FIG. 4 shows a block diagram of a QLED display device that is implemented with a method for canceling optical crosstalk of the QLED display panel according to the present invention.
Figure 5:
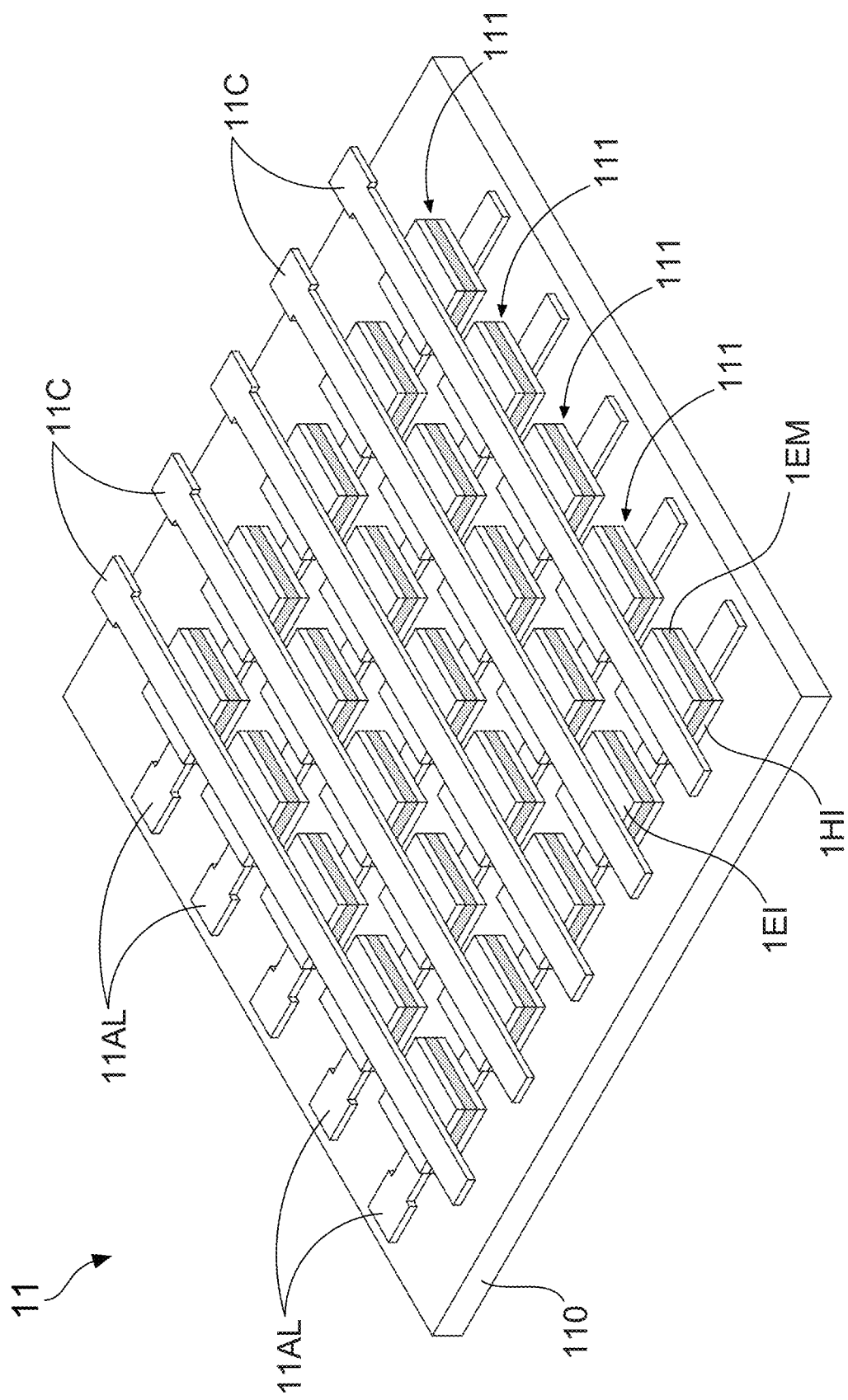
FIG. 5 shows a schematic stereo diagram of a QLED display panel of the forgoing QLED display device.

With reference to FIG. 4, there is shown a block diagram of a QLED display device that is implemented with a method for canceling optical crosstalk of the QLED display panel according to the present invention. The method for canceling optical crosstalk of the QLED display panel is provided for being applied in a QLED display device that comprises a QLED display panel 11, a row driver unit 12, a column driver unit 13, and a control unit 14. In which, the QLED display panel 11 comprises M number of anode wires 11A, N number of cathode wires 11C and M×N number of QLED elements 111. FIG. 5 shows a schematic stereo diagram of a QLED display panel of the forgoing QLED display device. From FIG. 5, it is known that the QLED element 111 comprises: a hole transport layer 1HI formed on the anode layer 11A, an emission layer 1EM formed on the hole transport layer 1HI, and an electron transport layer 11EI formed on the emission layer 1EM, wherein the electron transport layer 11EI is also connected with the cathode wire 11C.

Figure 6:
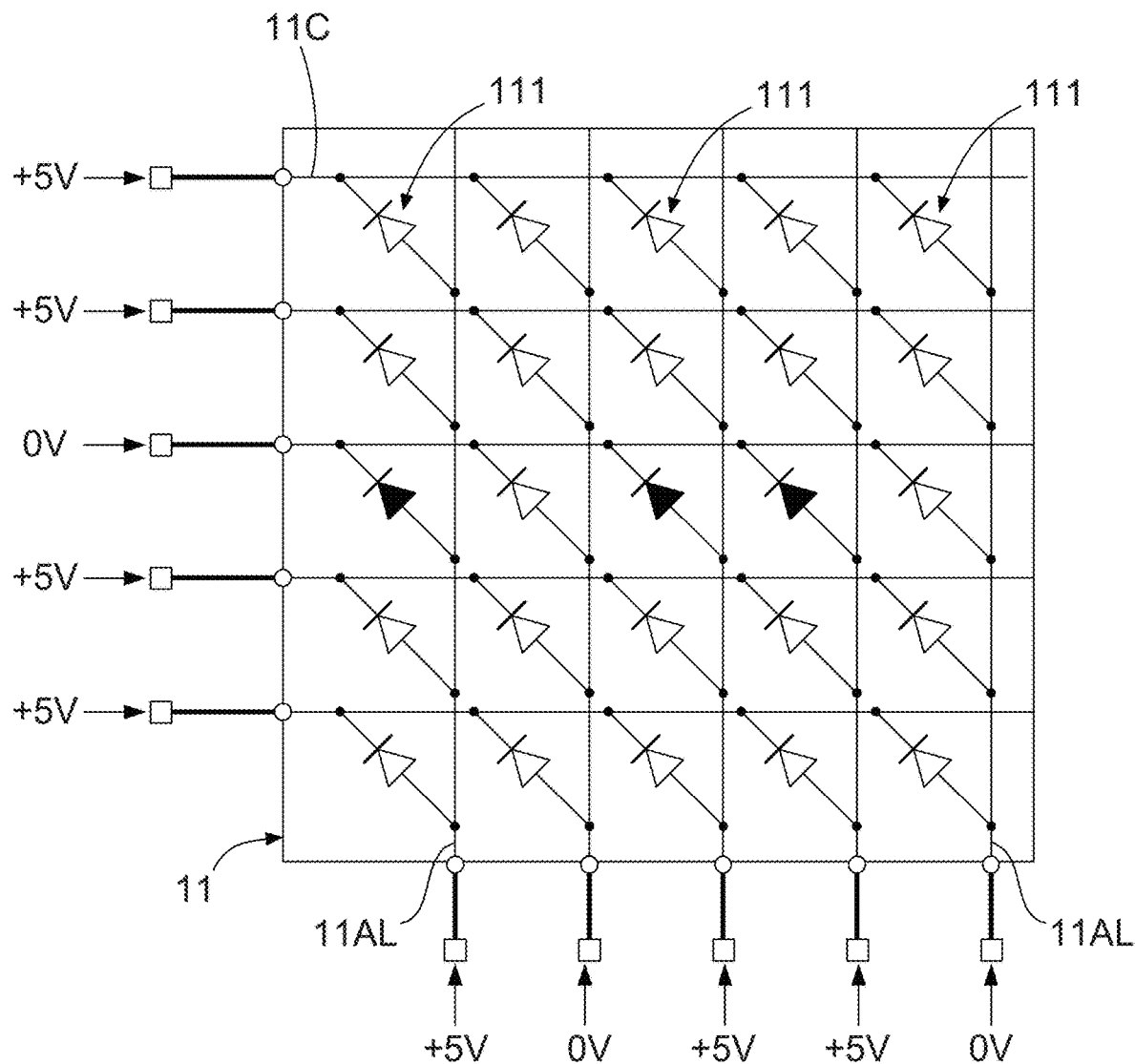
FIG. 6 shows a topology diagram of an equivalent circuit of the forgoing QLED display panel.

Because the forgoing control unit 14 is commonly a microprocessor unit, the method of canceling optical crosstalk of the QLED display panel of the present invention can be implemented in the control unit 14 by a form of application program, library, variables, or operands. On the other hand, FIG. 6 illustrates a topology diagram of an equivalent circuit of the forgoing QLED display panel 11. As FIG. 4 and FIG. 6 show, the method is configured for firstly letting the control unit 14 control the column driver unit 13 to transmit a column drive signal to at least one of the M number of anode wires 11A during the normal operation of the QLED display device, thereby letting the at least one anode wire 11A be addressingly selected. Subsequently, the method is configured for letting the control unit 14 control the column driver unit 13 to transmit a column drive signal to at least one of the M number of anode wires 11A, so as to let the at least one anode wire 11A be addressingly selected. Consequently, in case of the column drive signal being transmitted in the at least one addressingly-selected anode wire 11A, the control unit 14 controls the row driver unit 13 to transmit a first row drive signal to at least one of the N number of cathode wires 11C that has an space overlap or a space intersection with the addressingly-selected anode wire 11A. Simultaneously, the control unit 14 also controls the row driver unit 13 to transmit a second row drive signal to the other of the N number of cathode wires 11C that not overlap or intersect with the addressingly-selected anode wire 11A in space.

According to the present invention, the second row drive signal and the column drive signal has an identical timing waveform. For example, both the column drive signal and the second drive signal can be a bias voltage signal or a bias current signal. As such, during at least one QLED element 111 is addressingly-selected to achieve a light emission, several QLED element 111 that are adjacent to the addressingly-selected QLED element 111 would not be driven to emit slight-intensity light, thereby effectively reducing and/or canceling optical crosstalk in the QLED display panel 11.

First Embodiment of QLED Display Panel

Figure 7:
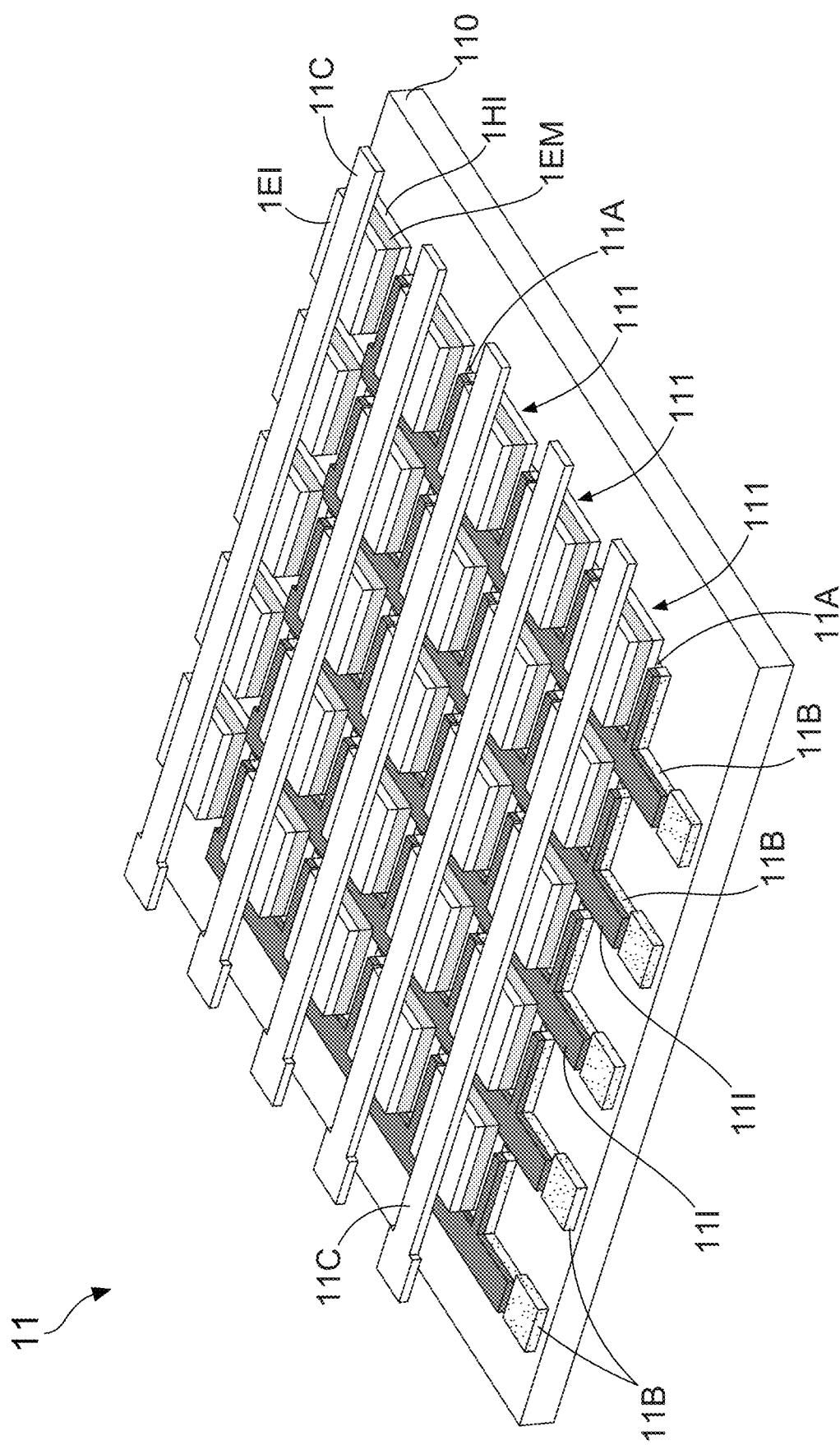
FIG. 7 shows a schematic stereo diagram of a first embodiment of a QLED display panel according to the present invention.
Figure 8:
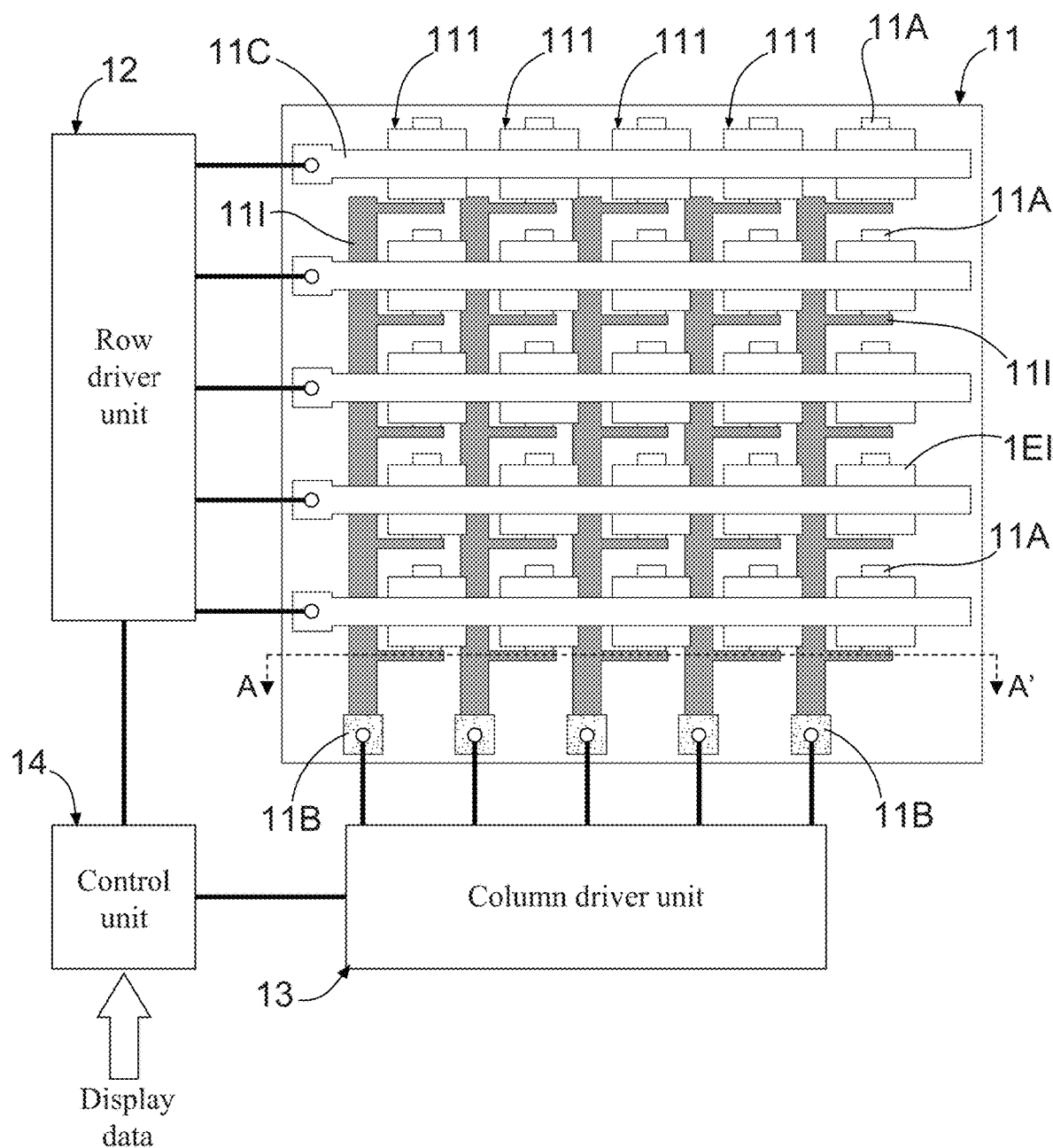
FIG. 8 shows a block diagram of a QLED display device using the QLED display panel according to the present invention.

FIG. 7 shows a schematic stereo diagram of a first embodiment of a QLED display panel according to the present invention, and FIG. 8 shows a block diagram of a QLED display device using the QLED display panel according to the present invention. From FIG. 7 and FIG. 8, it is understood that the present invention provides a QLED display panel 11, which comprises a substrate 110, a plurality of anode layers 11A, M×N number of QLED elements 111, M number of cathode wires 11C, and N number of column wires 11B. According to the present invention, the substrate 110 is made of a transparent material, and both M and N are a positive integer. Moreover, the plurality of anode layers 11A are formed on the substrate 110, and are arranged to M rows and N columns. In one practicable embodiment, the anode layer 11A is made of a material that is selected from the group consisting of nickel (Ni), platinum (Pt), vanadium (V), chromium (Cr), copper (Cu), zinc (Zn), gold (Au), fluorine-doped tin oxide (FTO), indium tin oxide (ITO), zinc oxide (ZnO), ZnO-doped gallium oxide (ZnO—Ga$_2$O$_3$), alumina-doped zinc oxide (ZnO—Al$_2$O$_3$), and tin oxide (SnO). On the other hand, a material for making the cathode layer 11C is selected from the group consisting of magnesium (Mg), calcium (Ca), titanium (Ti), indium (In), lithium (Li), aluminum (Al), silver (Ag), tin (An), compound of lithium fluoride (LiF) and (Al, and compound of LiF and Ca.

As described in more detail below, the M×N number of QLED elements 111 are formed on the plurality of anode layers 11A, respectively. According to the present invention, the QLED element 111 comprises a hole transport layer 1HI formed on the anode layer 11A, an emission layer 1EM formed on the hole transport layer 1HI, and an electron transport layer 11EI formed on the emission layer 1EM, wherein the electron transport layer 11EI is also connected with the cathode wire 11C. In one practicable embodiment, a material for making the hole transport layer 1HI is selected from the group consisting of molybdenum oxide (MoO$_3$), 2,2',7,7'-tetrakis[N,N-di(4-methoxyphenyl)amino]-9,9'-spirobifluorene (spiro-OMeTAD), poly(2,3-dihydrothieno-1,4-dioxin)-poly(styrenesulfonate) (PEDOT:PSS), N,N'-bis(3-methylphenyl)-N,N'-diphenylbenzidine (TPD), poly-TPD (PTPD), and poly(3-hexylthiophene-2,5-diyl) (P3HT). On the other hand, a material for making the electron transport layer 1EI is selected from the group consisting of tris(8-hydroxyquinoline)aluminum (Alq3) and 2,2',2"-(1,3,5-Benzinetriyl)-tris(1-phenyl-1-H-benzimidazole) (TPBi).

According to the present invention, the emission layer 1EM comprises a conducting polymer film and a plurality of quantum dots (QDs) that are incorporated in the conducting polymer film. In case of the QLED display device is a monochrome display device, each of the QDs is designed to radiate a monochrome light. Differently, the QDs are particularly designed to consist of a plurality of red QDs, a plurality of green QDs, and a plurality of blue QDs for making the QLED display device that includes the QLED display panel 11 of the present invention be a color display device.

It is worth noting that, the M number of cathode wires 11C are formed on the M×N number of QLED elements 111, so as to make each of the M number of cathode wires 11C be connected with N of the M×N number of QLED elements 111. FIG. 7 and FIG. 8 also depict that, the N number of column wires 11B is formed on the substrate 110, wherein each of the N number of column wires 11B has M number of extension portions 11B1, and each of the M number of extension portions 11B1 covers a part of one of the plurality of anode layers 11A, thereby making each of the N number of column wires 11B be electrically connected to M of the plurality of anode layers 11A. From FIG. 7 and FIG. 8, it is further found that, each of the N number of column wires 11B is covered by an insulation layer 11I.

Figure 9:
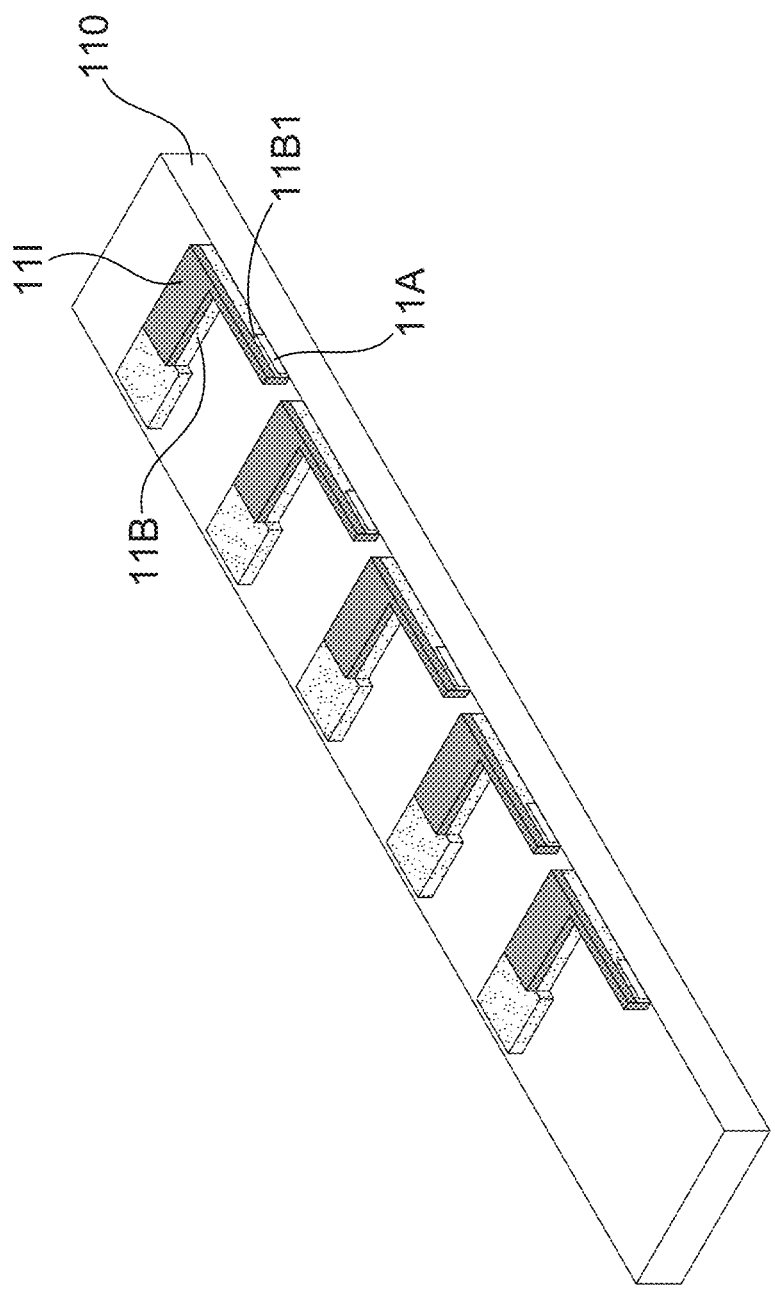
FIG. 9 shows a sectional axonometric diagram for showing a substrate, N number of anode layers that is formed on the substrate, N number of column wires, and N number of insulation layers that respectively cover the N number of column wires.

With reference to FIG. 7 and FIG. 8 again, and please simultaneously refer to FIG. 9, which illustrates a sectional axonometric diagram for showing the substrate 110, the N number of anode layers 11A that is formed on the substrate 110, the N number of column wires 11B, and the N number of insulation layers 11I that respectively cover the N number of column wires 11B. It needs to further explain that, the sectional axonometric object shown in FIG. 9 is obtained by using a section line A-A' shown in FIG. 8 to cut the QLED display panel 11. Herein, it needs to further explain that, FIG. 7 depicts that the insulation layer 11I merely cover the column wire's 11B surface. However, that is not used for becoming a limitation for a combination way of the column wire 11B and the insulation layer 11I. In a practicable embodiment, the insulation layer 11I can be formed by using atomic layer deposition (ALD) technology, so as to be coated onto the column wire 11B. As such, each of the surfaces of the column 11B is coated with the insulation layer 11I except for the bottom surface.

Figure 1:
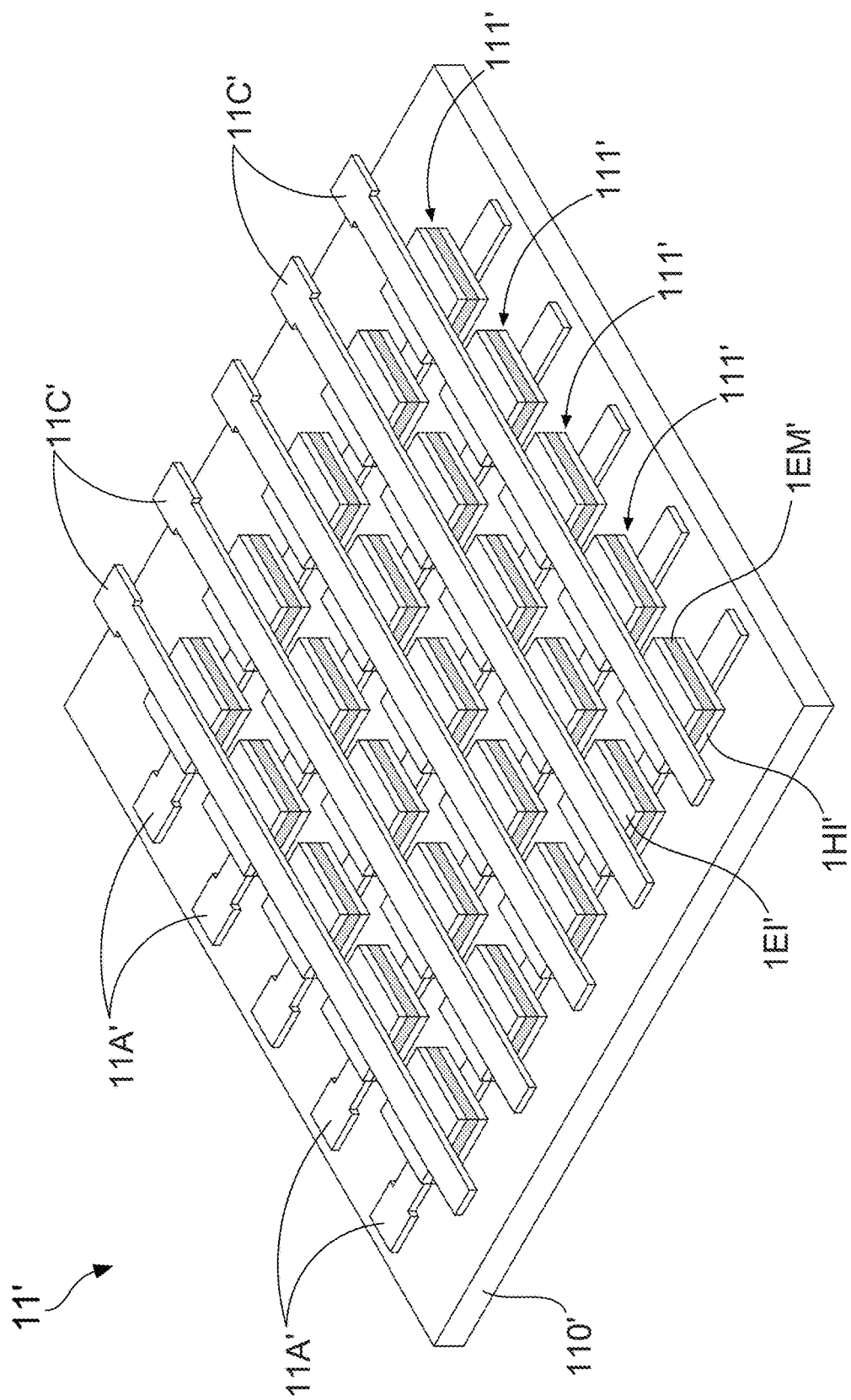
FIG. 1 shows a schematic stereo diagram of a conventional QLED display panel.
Figure 2:
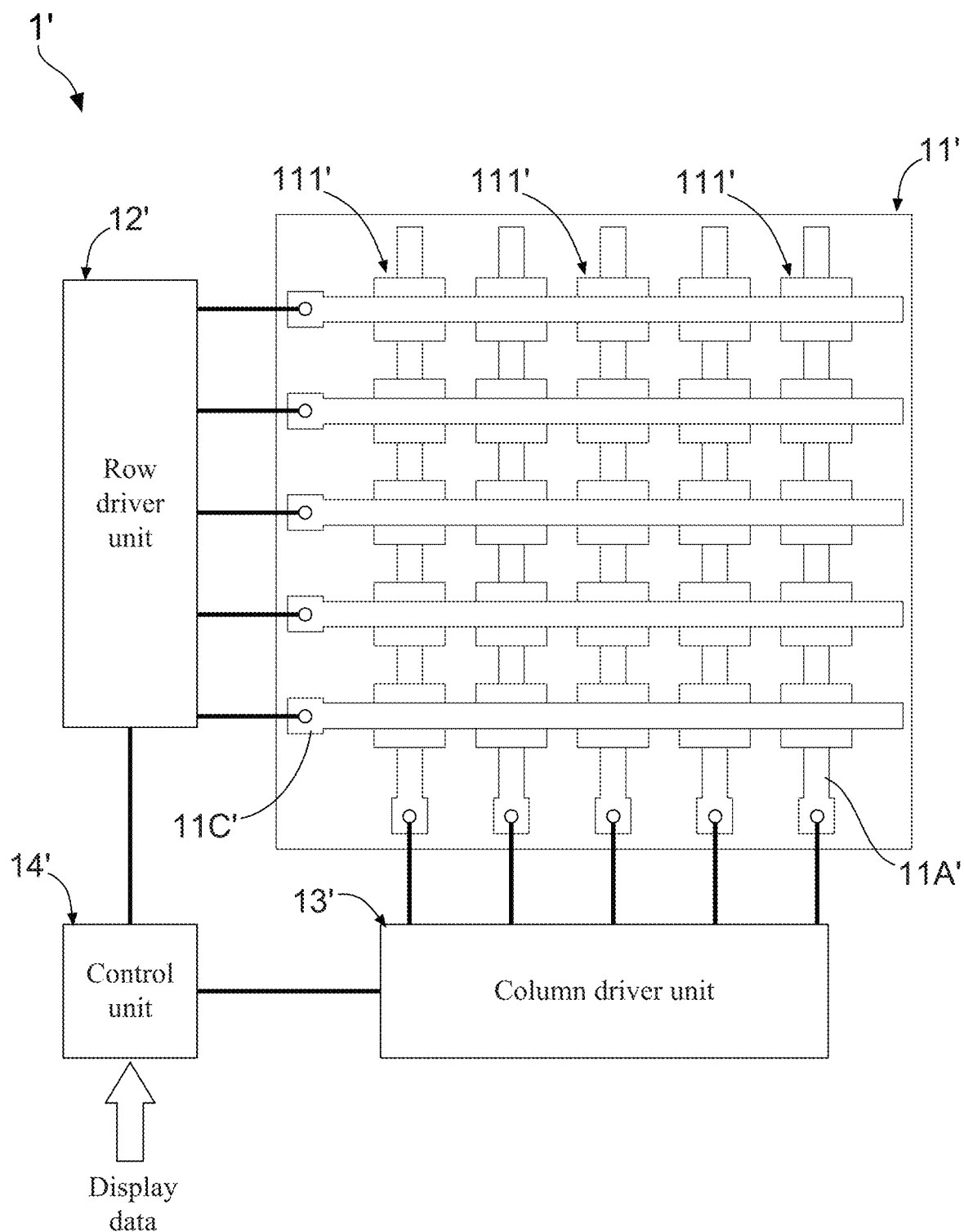
FIG. 2 shows a first block diagram of a conventional QLED display device using the forgoing QLED display panel.
Figure 3:
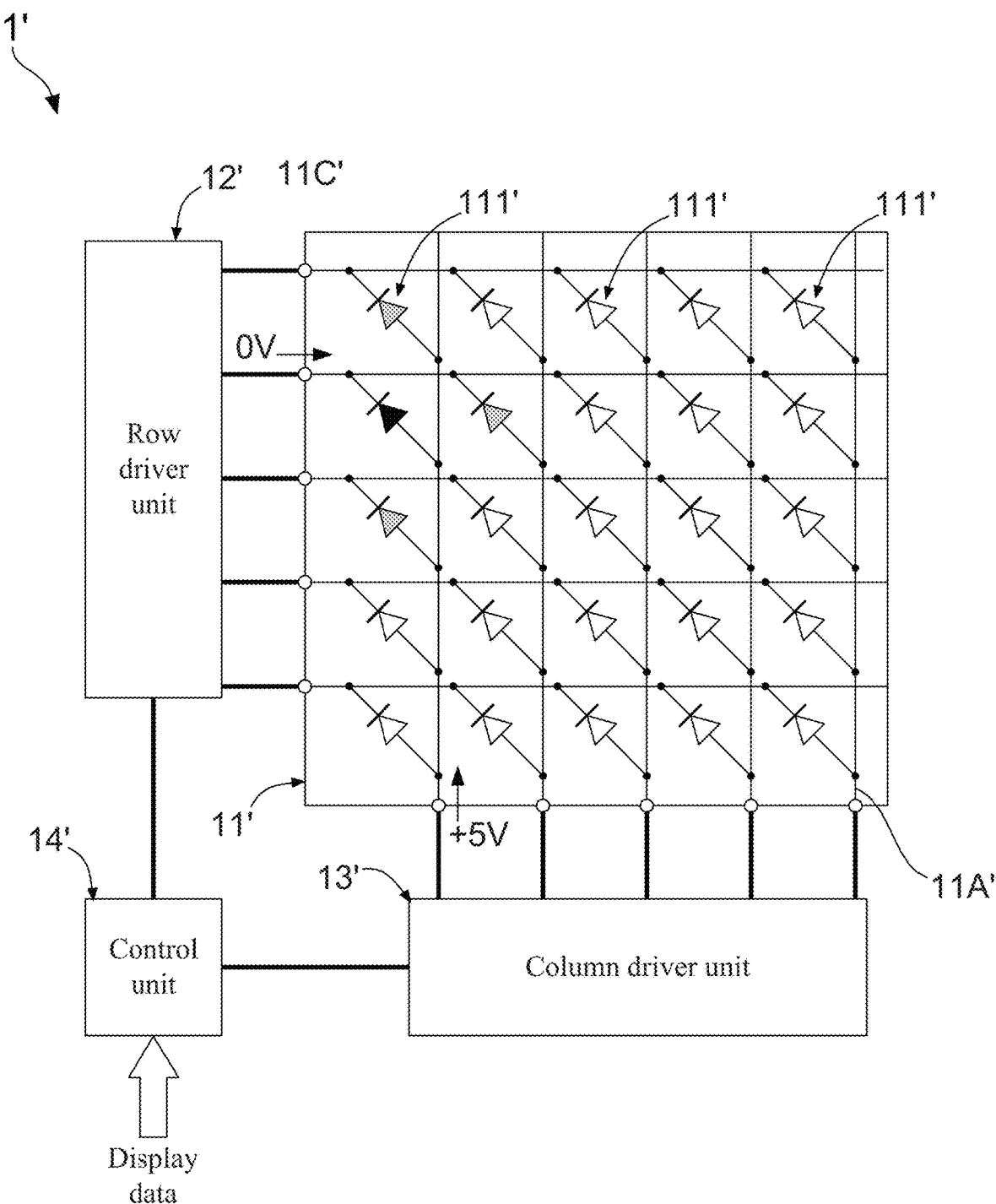
FIG. 3 shows a second block diagram of the conventional QLED display device.

As FIG. 1 and FIG. 2 shows, the conventional QLED display panel 11' includes M number of anode wires 11A' that are connected to the row driver unit 13'. Differently, as FIG. 7 and FIG. 8 show, the novel QLED display panel 11 of the present invention includes M×N number of anode layers 11A that are not used for connecting with the row driver unit 13. According to particular design of the present invention, N number of column wires 11B is formed on the substrate 110, and each of the N number of column wires 11B has M number of extension portions 11B1. By such arrangement, each of the N number of column wires 11B is electrically connected to M of the M×N number of anode layers 11A after letting each of the M number of extension portions 11B1 cover a part of one of the plurality of anode layers 11A. In one practicable embodiment, the forgoing column wire 11B is made of silver (Ag), such that the column wire 11B has a low sheet resistance. Moreover, by using the insulation layer 11I to cover (enclose) the column wire 11B, a voltage coupling effect occurring between an addressingly-selected column 11B and at least one column 11B that is adjacent to the addressingly-selected column 11B and not selected addressingly would be largely abated, leading the optical crosstalk in the QLED display panel 11 to be effectively reduced and/or canceled.

Second Embodiment of QLED Display Panel

Figure 10:
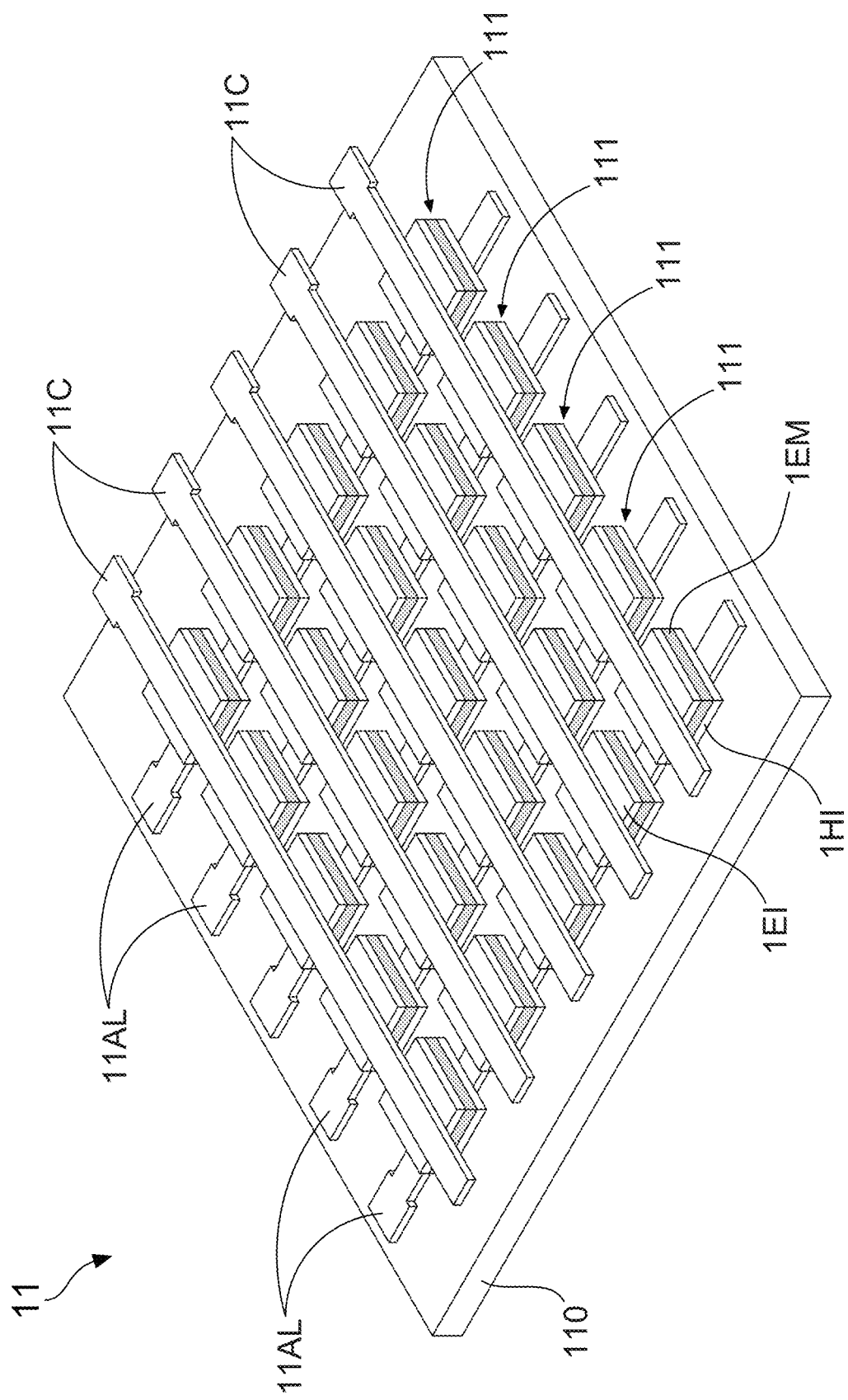
FIG. 10 shows a schematic stereo diagram of a second embodiment of the QLED display panel according to the present invention.
Figure 11:
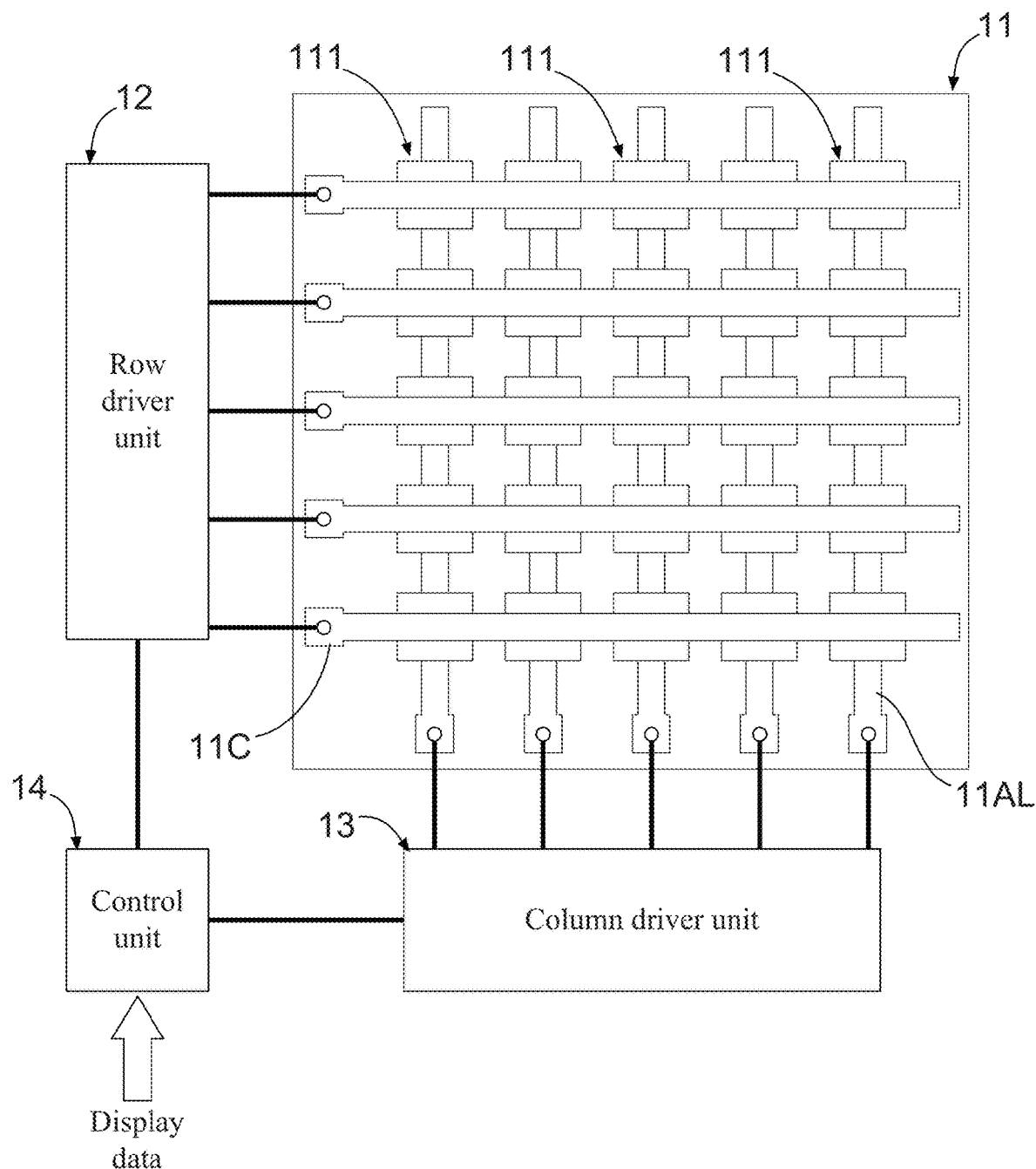
FIG. 11 shows a block diagram of a QLED display device using the QLED display panel according to the present invention.
Figure 12:
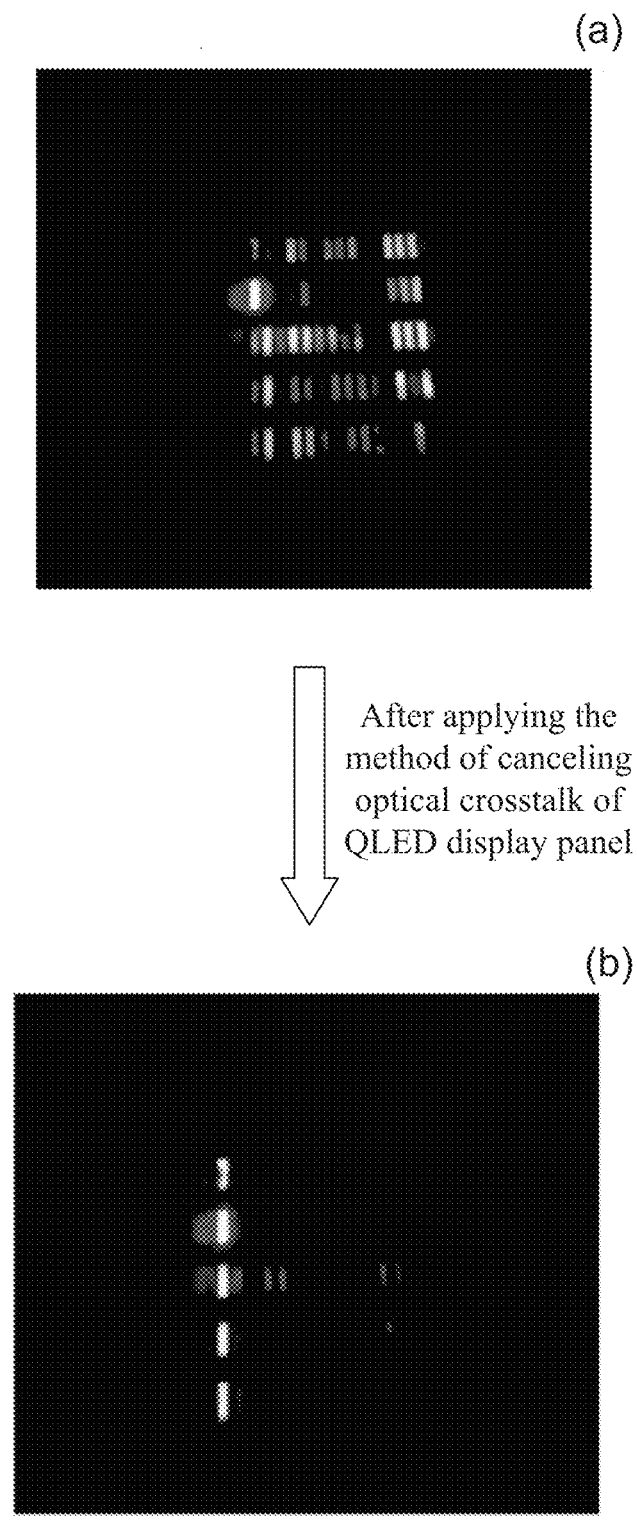
FIG. 12 shows a test image diagram for showing a QLED display panel in control group.

FIG. 10 shows a schematic stereo diagram of a second embodiment of the QLED display panel according to the present invention, and FIG. 8 shows a block diagram of a QLED display device using the QLED display panel according to the present invention. As FIG. 11 and FIG. 12 show, the second embodiment of the QLED display panel 11 is included in a QLED display device, and the QLED display device further includes a row driver unit 12, a column driver unit 13 and a control unit 14. In second embodiment, the QLED display panel 11 basically comprises a substrate 110, N number of anode wires 11AL, M×N number of QLED elements 111, and M number of cathode wires 11C. In which, the QLED element 111 comprises a hole transport layer 1HI formed on the anode wire 11AL, an emission layer 1EM formed on the hole transport layer 1HI, and an electron transport layer 11E' formed on the emission layer 1EM, wherein the electron transport layer 11EI is also connected with the cathode wire 11C.

According to the particular design of the present invention, the emission layer 1EM of the QLED element 111 is designed to comprise a conducting polymer film and a plurality of quantum dots (QDs) that are incorporated in the conducting polymer film, wherein the QD comprises a core and at least one shell layer, and a diameter of the QD and a thickness of the at least one shell layer have a specific ratio that is in a range between 1.3 and 2.

Experimental Data

Engineers skilled in development and manufacture of quantum dots (QDs) certainly know that, because of including surface defects, the forgoing core of the quantum dot that is made of CdS, CdZnS, CdZnSe, CdZnSeS, or ZnSe is found to exhibit a quantum yield (QY) that is not greater than 70%. Accordingly, by using at least one shell to enclose the core, a core-shell QD with high stability and outstanding QY is therefore obtained. In second embodiment of the QLED display panel 11, a diameter of the QD and a thickness of the at least one shell layer is particularly designed to have a specific ratio. For verifying whether letting the forgoing specific ratio be in a range between 1.3 and 2 is helpful in effectively reducing optical crosstalk in a QLED display panel, following table (1) lists two samples of QLED display panel that are designed for a control group and an experimental group.

TABLE 1

|  | QD (core/shell) | QD diameter | Shell thickness |
| --- | --- | --- | --- |
| control group | ZnCdSe/CdS/ZnCdS | 7 nm | ~1-2 nm |
| experimental group | ZnCdSe/ZnSeS/ZnS | 12 nm | ~7-8 nm |

Figure 13:
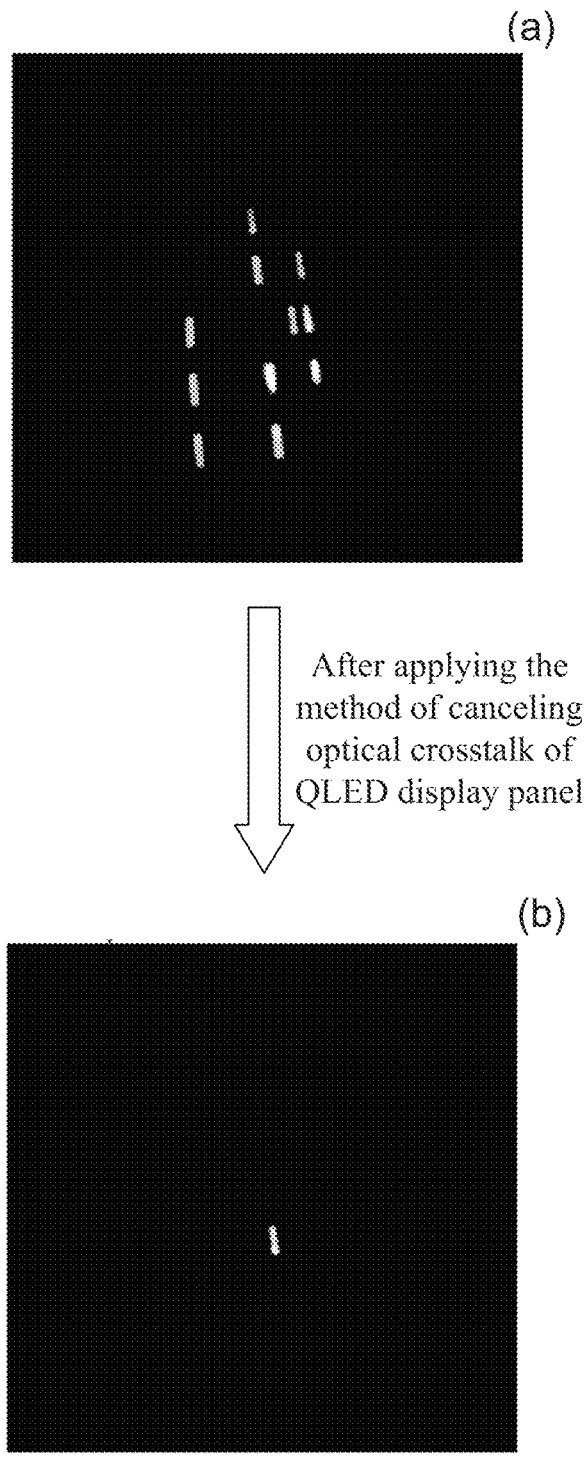
FIG. 13 shows a test image diagram for showing a QLED display panel in experimental group.

FIG. 12 shows a test image diagram for showing a QLED display panel in control group. In FIG. 12, image (a) shows that the QLED display panel in control group suffers from optical crosstalk after the QLED display panel is normally driven to display a specific pattern. However, image (b) shows that the optical crosstalk occurring in the QLED display panel are largely reduced after the method of canceling optical crosstalk of QLED display panel proposed by the present invention is implemented. On the other hand, FIG. 13 shows a test image diagram for showing a QLED display panel in experimental group. In FIG. 13, image (a) shows that the QLED display panel in experimental group still includes a little optical crosstalk after the QLED display panel is normally driven to display a specific pattern. However, image (b) shows that the optical crosstalk occurring in the QLED display panel are almost completely canceled the method of canceling optical crosstalk of QLED display panel proposed by the present invention is implemented.

Experimental results have revealed that, in case of a core diameter of a core-shell QD being fixed, it is able to make the surface energy gap of the core-shell QD be increased by thickening the shell thickness. As such, after the particularly-designed core-shell QDs are applied in manufacturing a QLED element 111, turn-on voltage of the QLED element 111 is therefore increased, and leakage current of the QLED element 111 is also inhibited.

Therefore, through above descriptions, the QLED display panel and the method for canceling optical crosstalk of the QLED display panel proposed by the present invention have been introduced completely and clearly. The above description is made on embodiments of the present invention. However, the embodiments are not intended to limit scope of the present invention, and all equivalent implementations or alterations within the spirit of the present invention still fall within the scope of the present invention.

What is claimed is:

1. A method for canceling optical crosstalk, being applied in a QLED display device that comprises a QLED display panel, a row driver unit, a column driver unit, and a control unit, wherein the QLED display panel comprises M number of anode wires, N number of cathode wires and M×N number of QLED elements, and the method comprising following steps:

letting the control unit control the column driver unit to transmit a column drive signal to at least one of the M number of anode wires, so as to let the at least one anode wire be addressingly selected;

in case of the column drive signal being transmitted in the at least one addressingly-selected anode wire, letting the control unit control the row driver unit to transmit a first row drive signal to at least one of the N number of cathode wires that has a space overlap or a space intersection with the addressingly-selected anode wire, and letting the control unit control the row driver unit to simultaneously transmit a second row drive signal to the other of the N number of cathode wires that not overlap or intersect with the addressingly-selected anode wire in space;

wherein the second row drive signal and the column drive signal has an identical timing waveform.

2. The method of claim 1, wherein the row driver unit is provided with a signal switch therein, and the signal switch comprising:

a first signal switching unit, being used for coupling the first row drive signal to the at least one cathode wire that has the space overlap or the space intersection with the at least one addressingly-selected anode wire; and a second signal switching unit, being used for coupling the second row drive signal to the cathode wires that not overlap or intersect with the addressingly-selected anode wire in space.

3. The method of claim 1, wherein both the column drive signal and the second drive signal are selected from the group consisting of bias voltage signal and bias current signal.

4. A QLED display panel, comprising:
a substrate;
N number of anode wires, being formed on the substrate;
M×N number of QLED elements, being formed on the N number of anode wires, so as to make each of the N number of anode wires be connected with M of the M×N number of QLED elements; and
M number of cathode wires, being formed on the M×N number of QLED elements, so as to make each of the M number of cathode wires be connected with N of the M×N number of QLED elements;
wherein both M and N are a positive integer, and the QLED element comprising:

a hole transport layer, being formed on the anode wire;
an emission layer, being formed on the hole transport layer; and
an electron transport layer, being formed on the emission layer, and being connected with the cathode wire;
wherein the emission layer comprises a conducting polymer film and a plurality of quantum dots (QDs) that are incorporated in the conducting polymer film;
wherein the QD comprises a core and at least one shell layer, and a diameter of the QD and a thickness of the at least one shell layer having a specific ratio that is in a range between 1.3 and 2.

5. The QLED display panel of claim 4, wherein the substrate is made of a transparent material.

6. The QLED display panel of claim 4, wherein a material for making the anode wire is selected from the group consisting of nickel (Ni), platinum (Pt), vanadium (V), chromium (Cr), copper (Cu), zinc (Zn), gold (Au), fluorine-doped tin oxide (FTO), indium tin oxide (ITO), zinc oxide (ZnO), ZnO-doped gallium oxide (ZnO—$Ga_2O_3$), alumina-doped zinc oxide (ZnO—$Al_2O_3$), and tin oxide (SnO).

7. The QLED display panel of claim 4, wherein a material for making the cathode layer is selected from the group consisting of magnesium (Mg), calcium (Ca), titanium (Ti), indium (In), lithium (Li), aluminum (Al), silver (Ag), tin (An), compound of lithium fluoride (LiF) and (Al, and compound of LiF and Ca.

8. The QLED display panel of claim 4, wherein a material for making the hole transport layer is selected from the group consisting of molybdenum oxide ($MoO_3$), 2,2',7,7'-tetrakis[N,N-di(4-methoxyphenyl)amino]-9,9'-spirobifluorene (spiro-OMeTAD), poly (2,3-dihydrothieno-1,4-dioxin)-poly(styrenesulfonate) (PEDOT:PSS), N,N'-bis(3-methylphenyl)-N,N'-diphenylbenzidine (TPD), poly-TPD (PTPD), and poly(3-hexylthiophene-2,5-diyl) (P3HT).

9. The QLED display panel of claim 4, wherein a material for making the electron transport layer is selected from the group consisting of tris(8-hydroxyquinoline)aluminum (Alq3) and 2,2',2"-(1,3,5-Benzinetriyl)-tris(1-phenyl-1-H-benzimidazole) (TPBi).

* * * * *